United States Patent
Lee et al.

(10) Patent No.: US 8,048,494 B2
(45) Date of Patent: Nov. 1, 2011

(54) DIAMOND SHELL FABRICATED BY USING POROUS PARTICLE AND THE FABRICATION METHOD THEREOF

(75) Inventors: Jae-Kap Lee, Seoul (KR); Phillip John, Edinburgh (GB)

(73) Assignee: Korea Institute of Science and Technology (KR)

( * ) Notice: Subject to any disclaimer, the term of this patent is extended or adjusted under 35 U.S.C. 154(b) by 814 days.

(21) Appl. No.: 11/911,452

(22) PCT Filed: Apr. 13, 2006

(86) PCT No.: PCT/KR2006/001368
§ 371 (c)(1),
(2), (4) Date: Oct. 12, 2007

(87) PCT Pub. No.: WO2006/110004
PCT Pub. Date: Oct. 19, 2006

(65) Prior Publication Data
US 2008/0318023 A1      Dec. 25, 2008

(30) Foreign Application Priority Data
Apr. 13, 2005   (KR) .................. 10-2005-0030824

(51) Int. Cl.
*C23C 16/27*       (2006.01)
(52) U.S. Cl. .................. 427/577; 216/83; 428/307.7
(58) Field of Classification Search .................. None
See application file for complete search history.

(56) References Cited

U.S. PATENT DOCUMENTS

| | | | |
|---|---|---|---|
| 5,129,850 A * | 7/1992 | Kane et al. ............ | 445/24 |
| 6,051,152 A | 4/2000 | Natishan et al. ........ | 216/78 |
| 6,261,469 B1 | 7/2001 | Zakhidov et al. ...... | 216/56 |
| 7,309,446 B1 * | 12/2007 | Kley ...................... | 216/11 |
| 2007/0104399 A1 * | 5/2007 | Hamza et al. .......... | 384/91 |

FOREIGN PATENT DOCUMENTS

| | | |
|---|---|---|
| JP | 5-345697 | 12/1993 |
| KR | 2002-0023502 | 3/2002 |
| WO | WO 2006/043786 | 4/2006 |

OTHER PUBLICATIONS

PCT International Search Report dated Jul. 19, 2006 issued in corresponding PCT International Patent Appln. PCT/KR2006/001368.

* cited by examiner

*Primary Examiner* — Timothy Meeks
*Assistant Examiner* — Joseph Miller, Jr.
(74) *Attorney, Agent, or Firm* — Ostrolenk Faber LLP

(57) ABSTRACT

A hollow diamond shell with a size of a few micrometer to hundreds of micrometer and having a geometrical shape and its fabrication method are disclosed. A diamond film is deposited by a CVD method and porous grits are used as a victim substrate to be etched later, so that the substrate can be easily removed by a capillary phenomenon that an etching solution can be intensively absorbed in a substrate etching process. Thus, a perfect diamond shell with only a plurality of fine pores with a nano size without any conspicuous opening can be obtained. Also, a diamond shell with a small opening of below 10 percent of the surface area of grits can be fabricated by controlling a nuclear generation of diamond particles.

12 Claims, 2 Drawing Sheets

[Fig. 1]
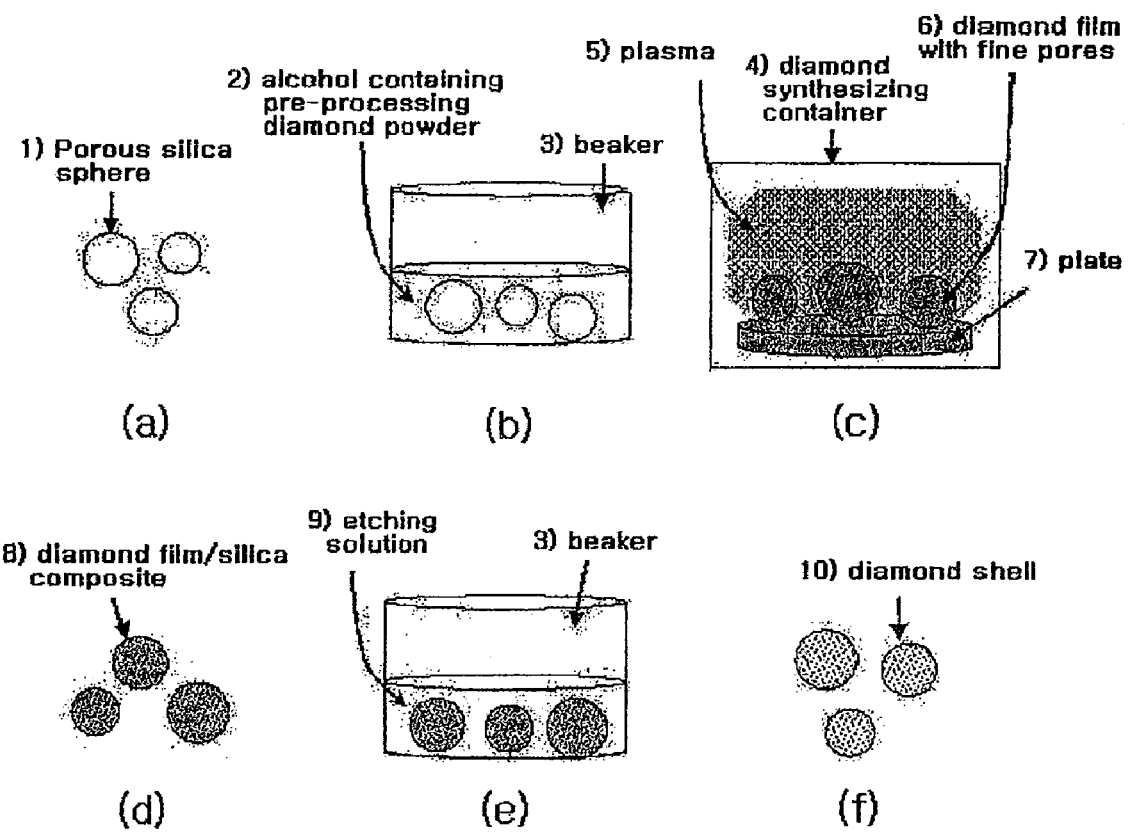

[Fig. 2]
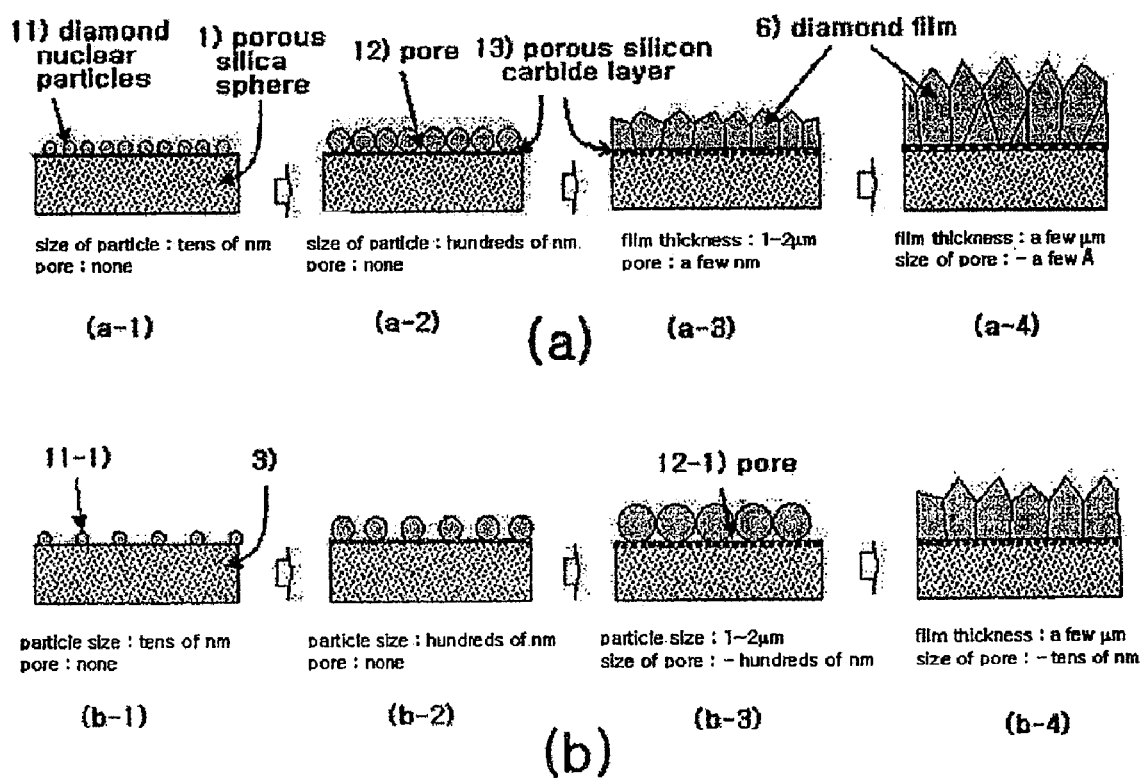

DIAMOND SHELL FABRICATED BY USING POROUS PARTICLE AND THE FABRICATION METHOD THEREOF

TECHNICAL FIELD

The present invention relates to a diamond shell fabricated by using a porous particle and its fabrication method and, more particularly, to a complete diamond shell having fine pores of nano size without any opening portion fabricated by using a porous particle as a matrix used as a victim frame during a process of fabricating a diamond shell and its fabrication method.

BACKGROUND ART

Artificial diamond is synthesized by a high pressure and high temperature (HPHT) method, a detonation method, or a chemical vapor deposition (CVD) method.

Diamond synthesized by the HPHT (synthesis conditions: about 50,000 air pressure and 1,400° C.) developed in 1955 has cubo-octahedron grit or irregular powder form with a size of below a few hundreds µm. Diamond obtained by a single crystal growth method performed also under the HPHT has a bulk form with a size of a few $mm^3$. Diamond obtained by a detonation method (about 100,000 air pressure, 1,000° C.) has a powder form close to a spherical shape with a size of a few nm.

The general shape of diamond obtained by the HPHT method and the detonation method has such grit (or powder) form as natural diamond. This is because volume of an equipment that can generate a high pressure (above about 50,000 air pressure) to obtain diamond, a high temperature and high pressure phase of carbon, is limited.

Meanwhile, in 1980s, the CVD method (primary synthesizing conditions: about 100 Torr and 700° C.), by which diamond can be synthesized at below an atmospheric pressure, was developed so that more diverse types of diamond can be fabricated. According to the CVD synthesis method, a gas is activated by using heat or plasma in a certain vacuum container and deposited in a type of a polycrystalline film on a surface of a matrix(substrate) maintained at about 700° C. In this case, diamond is limited to be deposited on the surface of the matrix that contacts with vapor phase. In the CVD method, the synthesis area depends on volume of plasma generated in the used equipment, and the shape of diamond film depends on the shape of the used matrix. The diamond film is deposited with a thickness of a few nm~a few mm on the platy matrix. It is used in the state of being attached on the matrix like an insert tool or a drill (direct coating: a thin film of below tens of µm) or used in a type of free standing film separated from the matrix(tens of µm~a few mm). In addition, a diamond free standing film in a dome shape with a diameter of a few $cm^2$ can be fabricated by using a matrix with a bent portion. In addition, by inducing a uniform nuclear generation in vapor phase according to the CVD method, a spherical diamond powder with a size of a few hundreds of nm can be synthesized.

However, the related art diamond synthesizing methods cannot fabricate diamond with a hollow shell structure.

DISCLOSURE OF THE INVENTION

Therefore, an object of the present invention is to provide a method for fabricating a diamond shell with an opening smaller by 10% than a shell surface (referred to hereinafter as 'diamond shell with an opening') or a diamond shell with fine pores of a nano (1-1000 nm) size without any conspicuous opening (referred to hereinafter as perfect diamond shell).

To achieve these and other advantages and in accordance with the purpose of the present invention, as embodied and broadly described herein, there is provided a method for fabricating a diamond shell comprising: preparing a porous matrix having a geometrical shape such as a spherical or polyhedral shape; inserting the porous matrix in a diamond synthesis vacuum container, decomposing a raw material gas of diamond by plasma or thermal energy to deposit a uniform diamond film with one or more pores through which a liquid phase can pass on the porous matrix by a CVD method to obtain a diamond/matrix composite (complex body); and putting the composite in an etching solution to remove the porous matrix by a capillary phenomenon that the porous matrix absorb the etching solution. In this case, the thickness of the shell wall can be within the range of 5 percent to 10 percent of the size of the shell.

In addition, in the present invention, after the hollow diamond shell is inserted in the diamond synthesis vacuum container by using the hollow diamond shell as a matrix, a row material gas of diamond is decomposed by plasma or thermal energy to synthesize a diamond film by the CVD method, to thereby obtain a hollow diamond shell whose shell wall has a thickness 10 percent or greater of the shell size.

In the method for fabricating the hollow micro-diamond shell, the present invention provides the method for fabricating a perfect diamond shell having only fine pores with a nano size, which cannot be fabricated by a related art by using porous silica as a victim matrix. In the present invention, a diamond shell with an opening smaller by 10 percent than a surface area can be fabricated by using a selective pre-processing method. Such diamond shell having the chemical stability, the inherent properties of diamond and biocompatible characteristics can be used as a container for keeping a bio-material such as DNA or bacteria or a container for putting a vapor material such as a hydrogen gas, as well as a liquid phase such as medicines or perfume, and uniformly supplying it over time. In addition, the diamond shell can be used as a filler with a light weight and high strength in a bio-ceramic field such as artificial bones or in the fields of a sub-marine, aircraft, a spacecraft and military supplies, and also used as a low dielectric constant heat-radiation filler in a semiconductor industry. In addition, a perfect hollow diamond shell with a wall thickness of 10 percent to 30 percent of the shell size can be used as a structure material that requires a light weight and high strength, and a high crystalline diamond shell without a pure white color can be used as jewelry in a novel form.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1 is a schematic view showing a process of fabricating a diamond shell according to the present invention; and FIG. 2 is a schematic view showing a change in a size of pores generated while nuclear pores of diamond are grown to a film on a matrix, of which FIG. 2a shows a case that density of nuclear generation is high and FIG. 2b shows a case that density of nuclear generation is low.

MODES FOR CARRYING OUT THE PREFERRED EMBODIMENTS

Reference will now be made in detail to the preferred embodiments of the present invention, examples of which are illustrated in the accompanying drawings.

According to one embodiment of the present invention, porous silica particles of a size of micrometer with a geometrical shape such as a spherical or polyhedral shape are prepared as a matrix. The size of the pore of the porous silica particles can be different depending on a fabrication method. In case of using a sol-gel method, the size of the pore of the porous silica particles can be 10 Å~1,000 Å (the size of the matrix is 1 μm~100 μm), and in case of using an emulsion method, the size of the pore of the porous silica particles can be 10 Å~1 μm (the size of the matrix is 10 μm~5 mm). In this respect, however, the material and size of the matrix and the size of the pore are not limited thereto.

The porous matrix is a metal oxide including at least one of $SiO_2$, $Al_2O_3$ and $BaTiO_3$, or polymer, and an organic or inorganic material that can be easily deposited by a diamond film and etched by chemicals can be used. In addition, a porous a matrix with a hollow type can be used as the matrix.

The prepared porous silica particles are deposited through a general CVD diamond synthesizing process. A pre-processing step is selectively performed to facilitate synthesizing of diamond film, and a step of synthesizing the diamond film is performed by using a general CVD device to obtain a diamond/silica composite. Thereafter, the silica of the composite is removed in an etching step to fabricate a diamond shell. Each step will be described in detail as follows.

In the pre-processing step, a porous matrix 1 are put in a beaker 3 in which fine diamond powder with a size of below 1 μm has been distributed, vibrated in an ultrasonic bath during a certain time to form a scratch or a remnant on the surface of the matrix, so that a diamond nucleus can be easily formed during its synthesizing. The pre-processing step is commonly used for synthesizing general diamond (refer to FIG. 1b).

The pre-processed porous silica matrix is deposited during a certain time in a CVD diamond synthesizing device and then undergoes a synthesizing step so as to be a diamond/silica composite (refer to FIG. 1c).

In this case, the thickness of the film differs depending on the synthesis variables such as composition or a deposition time, and preferably, is about 5 percent to 10 percent of the general shell size. During the synthesizing step, an opening or pores is (are) to be formed on the diamond film, which will now be described in detail.

Next, the composite 8 is put in an etching solution 9 and undergoes the etching step for removing the matrix (FIG. 1e) to thereby fabricate diamond shells with fine pores or an opening. The etching solution can differ depending on the material and the purpose of the matrix.

The formation of the opening or the pores of the diamond shells can be primarily controlled in the pre-processing step by using the two following methods. One method is that a portion of the surface of the matrix is intentionally prevented from being pre-processed (selective pre-processing), on which a diamond film cannot be formed, whereby a diamond shell with an opening can be fabricated. Another method is that the pre-processing time is changed. This method is used for fabricating a perfect diamond shell without a plurality of fine pores without any opening. A pre-processing time in the general diamond film synthesizing (on the silicon substrate) takes about one hour. If the pre-processing time is shorter than that, the nuclear density can be reduced, and in this case, as described in detail in the following synthesizing step, fine pores can be formed.

After the pre-processing step, the pores can be finally controlled in the film synthesizing step. The synthesizing step includes a step of generating nuclear particles on the pre-processed porous matrix and growing the nuclear particles. In a general diamond film synthesis, spherical diamond nuclear particles with a size of a few to tens of nm are irregularly generated on the surface of the matrix, and then, the nuclear particles are grown to form a diamond film with a columnar structure (FIG. 2). Accordingly, pores are inevitably generated between nuclear particles in the film formation step. The size of the pores is in inverse proportion to the nuclear density. Thus, the size of the pores is small when the nuclear density is high (when the pre-processing time takes long) (FIG. 2a), whereas if the nuclear density is low (when the pre-processing time takes short), the size of the pores is large (FIG. 2b). In the step of forming the film, the size of the pores can be in the range from a few nano to a few micrometer and is reduced when the thickness of the film increases. During the process, the size of pores formed in the diamond film can be controlled to be variable from a few Å to a few μm (e.g., 1 Å to 5 μm).

In order to fabricate the diamond shells, the diamond film/silica composite fabricated according to the above-described method is put in a a matrix etching solution. The etching solution infiltrates into the silica matrix through the opening or the pores of the diamond film, and then, soaked up into the matrix by the capillary phenomenon of the porous matrix to thereby temporarily etch the entire a matrix so as to be removed. In this case, because there is no possibility that the shells are broken due to the partial etching that appears when non-porous silica is used, the perfect diamond shells with the fine pores can be stably fabricated.

In addition, in order to fabricate the diamond shell with an opening or the perfect diamond shells with fine pores without any conspicuous opening according to the selective pre-processing method, it is important to allow conditions for forming the uniform diamond film on the entire surface of the matrix during the diamond synthesizing.

Meanwhile, in the process of depositing diamond (C) on the silica ($SiO_2$) matrix, a silicon carbide (SiC) layer can be generated between the diamond film and the silica matrix, namely, on the silica surface. This is generally similar to a phenomenon that when diamond is deposited on the silicon (Si) substrate on which diamond film synthesizing is performed, a silicon carbide (SiC) layer is generated. Silica is easily etched in hydrofluoric acid (HF), but the silicon carbide is not dissolved in the hydrofluoric acid. Thus, when the diamond shells are fabricated after silica is used as the matrix, a solvent for removing the silicon carbide layer together with silica should be used.

Actually, under the conditions that input power was 15 kW, methane composition of hydrogen gas was 10 percent, pressure was 100 Torr, a gas flow was 200 sccm, a diamond film/porous silica a matrix composite (blue color, opaque) was deposited in a multi-cathode DC PACVD diamond synthesizing apparatus for one hour was etched in a 10-percent HF aqueous solution for 24 hours. Thereafter, results of observing the composite using a scanning electron microscopy (SEM) show diamond shells. A layer of hundreds of nm was observed in the shells, and the layer was determined as the silicon carbide (SiC) according to an AES analysis result. This means that carbon atoms was intruded into silica ($SiO_2$) during synthesizing to form the silicon carbide layer. Because silicon carbide is not etched in the HF, the sample was additionally etched for 10 minutes in a boiling Murakami solution (3 g, NaOH, 30 g K-hexacyanoferrae(III), 60 ml water).

When the sample was observed by using the SEM, silicon carbide layer could not be observed. The thickness of the diamond is about 10 μm, which means that the silicon carbide layer was removed by the Murakami etching. In addition, it was observed that the color of the diamond shells was changed from the black (opaque) to a gray color (translucent) during the Murakami etching. It is noted that diamond is translucent, the remaining silicon carbide layer makes the diamond film/silica composite and the composite without only silica as silica has been removed have black color (opaque). Meanwhile, when the fabricated diamond film/silica composite was etched in the boiling Murakami solution for 10 minutes, silica and silicon carbide could be removed, without performing the hydrofluoric acid (HF) etching.

As mentioned above, the hollow diamond shells can be fabricated through the three steps of the pre-processing step performed on the surface of the porous silica matrix, the step of fabricating the diamond film/silica composite having a small opening (or fine pores), and the etching step performed on the porous matrix. By changing the shape of the matrix to a spherical, tetrahedron or hexagonal shape and the size of each matrix, diamond shells with various shapes and sizes can be fabricated. In addition, by changing the diamond synthesizing conditions, diamond shells having diamond films with various surface tissues and crystallinity can be fabricated.

By etching the diamond film/porous silica composite in the hydrofluoric acid (HF) to remain the silicon carbide layer on the diamond shell, a diamond/silicon carbide composite shell can be fabricated. The composite shell would have excellent mechanical characteristics such as high ductility or the like owing to the silicon carbide. In addition, by using the hollow porous silica shell as the substrate, a diamond film/hollow porous silica shell composite can be obtained in the synthesizing step.

By continuously performing the CVD diamond synthesizing by using the thusly fabricated diamond shell and diamond/silicon carbide composite shell as a matrix, a perfect hollow diamond shell that has thick shell wall (10 percent of the shell size or greater) and does not have fine pores can be fabricated. The shells would have compression strength as high as the particle-type diamond.

The present invention will now be described in detail with reference to the accompanying drawings.

FIG. 1 is a schematic view showing a process of fabricating a diamond shell according to the present invention.

As the matrix, porous silica spheres 1 are prepared as substrate particles (a) and put in a beaker 3 in which alcohol 2 containing pre-processing diamond powder is held, on which ultrasonic vibration pre-processing is performed for one hour (b). During the pre-processing process, the size of an opening of the shell can be controlled. The pre-processed silica particles are put in a diamond synthesizing chamber 4 in which plasma 5 is formed to deposit a diamond film. After the synthesizing is completed, the diamond film/substrate composite (d) is boiled in the Murakami solution for 10 minutes to etch silica matrix out (e) to obtain hollow spherical diamond shells 11.

FIG. 2 shows formation of the diamond film and a change in the size of pores when density of nuclear generation is high (FIG. 2a) and when density of nuclear generation is low (FIG. 2b). It is noted that when the nuclear density is low, larger pores are generated. The estimate size of the pores is within the range of a few A to hundreds of nm.

In the present invention, by using the porous silica as the matrix, the fine size of the opening or the pores of the shells that allows the solution to pass therethrough can be controlled to be smaller to thereby fabricate a perfect diamond shell. The diamond shells can be used as a liquid-phase container of bio molecules, chemicals, medicines, perfume, etc, and also as a vapor-phase container such as the hydrogen gas. In addition, the perfect hollow diamond shells without fine pores can be used for a structure material that requires to be light and have high strength or as jewelry.

The present invention will be explained in more detail in the following examples. It is to be understood that these examples are merely illustrative and it is not intended to limit the scope of the present invention to these examples.

Embodiment 1

A porous matrix was pre-processed in an ultrasonic bath for one hour before being synthesized, and used diamond powder had the size of 1 μm. Diamond was synthesized on the surface of porous silica spheres with a diameter of 25 μm~30 μm by using a multi-cathode DC power plasma CVD method. The synthesis conditions were that the inputted power was 15 kW, methane composition of hydrogen gas was 10 percent, pressure was 100 Torr, and a gas flow was 200 sccm. Time for the synthesizing was one hour. When the surface of silica was observed by using the SEM, it was confirmed that a diamond film was deposited except for a portion (5 percent to 10 percent of the entire surface) of each matrix, and in this respect, the portion on which the film was not deposited is considered as a portion that contacted with a plate 7. The composite has a block color (completely opaque), and the surface tissue includes a surface (100) and a mixture of the surfaces (100) and (111).

When a silica structure greater than 2 mm was used as the matrix, it is not possible to uniformly deposit a diamond film on the surface. Presumably, this is because when the matrix greater than 2 mm is used, plasma can be concentrated onto the upper surface of the matrix particles to cause a big temperature difference between the upper and lower surfaces of the matrix during diamond synthesizing. Reversely, if a silica substrate smaller than 200 nm is used, grits get tangled each other, failing to obtain independent grits after the diamond synthesizing.

Embodiment 2

A diamond film was synthesized under the same conditions as the Embodiment 1 except that the methane composition of hydrogen gas was 11 percent. When the surface of silica was observed by using the SEM, the result was that the surface tissue largely includes the surface 100 and other synthesizing behaviors were similar to the Embodiment 1. The color of the composite was also black (completely opaque).

Embodiment 3

Porous matrix was pre-processed for 10 minutes under the same conditions as the Embodiment 1. The diamond synthesizing conditions were the same as the Embodiment 1, and after diamond was synthesized for 30 minutes, the matrix was re-arranged and then diamond was again synthesized for 30 minutes (two-step synthesizing) to deposit a uniform diamond film on the entire surface of the matrix. The color of the composite was black (completely opaque) and the surface tissue include the surface 100 and the mixture of the surfaces (100) and (111), and the mixtures of the surfaces (100) and (111) were more observed. It is not easily to fine pores (opening) even with the SEM, because the film was uniformly synthesized on the entire surface of the matrix through the two-step synthesizing. Pores with the size of a few μm were found occasionally. Raman analysis results of the diamond shell show that there is a conspicuous diamond peak near 1332 cm-1 and a gentle peak between 1350 cm-1~1500 cm$^{-1}$ corresponding to a non-diamond phase (sp2) carbon. This confirms that the shell contains the non-diamond shape.

When the silica structure greater than 2 mm was used through two-step synthesizing, the film could be deposited uniformly. In this case, however, it is not possible to uniformly synthesize the film. Presumably, it is estimated that plasma can be concentrated onto a portion of the surface of the matrix during synthesizing, causing a large temperature difference between the portion of the surfaces of the matrix during the diamond synthesizing.

Meanwhile, in the diamond synthesizing step, by optimizing the deposition conditions according to a used synthesizing apparatus, the diamond film can be uniformly synthesized on the entire surface of the matrix without performing the above-described two-step synthesizing.

Embodiment 4

The matrix/diamond composite fabricated in Embodiment 1 was etched in 10-percent hydrofluoric acid aqueous solution for 24 hours. After etching, it was observed that the color of grits was black (completely opaque). When grits was observed by using the SEM, shell-shaped diamond was observed, and in this respect, a layer of few hundreds of nm in the shell was also observed. The layer was determined as silicon carbide (SiC) according to an AES analysis result. This means that, during the synthesizing, a carbon element infiltrated into silica ($SiO_2$) to form a silicon carbide layer. The silicon carbide is not etched by the hydrofluoric acid. In this manner, the diamond/silicon carbide composite shell was fabricated.

Embodiment 5

The matrix/diamond composite fabricated in Embodiment 1 was etched in a 10-percent hydrofluoric acid aqueous solution for 24 hours, and then etched again in a boiling Murakami solution (3 g NaOH 30 g K-hexacyanoferrae(III), 60 ml water) for 10 minutes. After etching, particles were changed to have a gray color (translucent). The result of observing the sample by using the SEM shows that there was no silicon carbide layer. The thickness of the diamond layer was about 10 μm. This means that a silicon carbide layer was removed according to the Murakami etching. It can be noted that the change in the color of the particles to the gray color from the black color, it can be noted that the silicon carbide layer causes the black color (opaque).

Embodiment 6

The matrix/diamond composite fabricated in Embodiment 1 was directly etched in the Murakami solution (3 g NaOH 30 g K-hexacyanoferrae(III), 60 ml water), not in the hydrofluoric acid aqueous solution, for 10 minutes. After etching, the diamond particles (shells) were changed to have a gray color (translucent). The outer appearance of the particles was the same as before being etched. This means that silica and silicon carbide layer of the particles (shells0 were removed. Accordingly, perfect diamond shells without nano pores could be obtained.

Embodiment 7

A diamond film containing a methane composition of 6 percent under the same conditions as Embodiment 3 was deposited for two hours (two-step synthesizing and each step was performed by one hour) to fabricate a diamond film/matrix composite. The composite has the size of 30 μm~35 μm and the black color and was opaque. The composite was etched in the boiling Murakami solution as shown in Embodiment 6 for 10 minutes. After the etching, it was noted that the outer appearance of the grits (diamond shells) was the same as before being etched but the color was changed to a white color. This means that silica and a silicon carbide layer of the shells were removed. When a shell was broken down and its tissue was observed by the SEM, it was noted that it has an pore with the size of a sub-μm and the thickness of the film was 8 μm. The piece of the broken diamond shell was transparent. It was also noted that the white color of the diamond shell was caused by diffusion of light due to the concavo-convex surface of the diamond shell.

Embodiment 8

The perfect hollow diamond shell having the nano air pore fabricated in Embodiment 7 was used as a matrix and synthesizing was performed by two steps (each step was performed two hours) for four hours under the diamond synthesizing conditions of Embodiment 7. The shell had the white color. Results of observation by using the SEM showed that the size of the shell was increased to 50 μm to 60 μm without an air pore. Accordingly, a perfect diamond shell was obtained without an air pore.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

The invention claimed is:

1. A method for fabricating a spherical diamond shell comprising:
    preparing a porous matrix having an overall discrete spherical shape;
    depositing a uniform diamond film, wherein the diamond film includes one or more pores, the diamond film being deposited onto the porous matrix in a CVD chamber, the depositing comprising decomposing precursor gases for diamond deposition by plasma or thermal energy, the depositing of the uniform diamond film forming a diamond/matrix composite;
    etching out the porous matrix of the composite via an etching solution, the etching being effected via a capillary phenomenon wherein the capillary phenomenon is such that the porous matrix absorbs the etching solution through the one or more pores in the diamond film, the one or more pores thereby functioning as openings in the diamond film,
    whereby the diamond shell is formed with an overall discrete spherical shape.

2. The method of claim 1, wherein the size of the porous matrix is within the range of 200 nm to 5 mm.

3. The method of claim 1, wherein the porous matrix is a metal oxide comprising at least one of $SiO_2$, $Al_2O_3$ and $BaTiO_3$, or polymer, and is made of an organic or inorganic material onto which a diamond film may be deposited and etched by chemicals.

4. The method of claim 1, wherein, in order to increase a nucleation density of diamond, a pre-processing step is performed prior to the depositing step, such that the porous matrix is pretreated by the ultrasonic irradiation using diamond powders dispersed in an alcohol solution for a sufficient time to form a scratch or a remnant on the surface of the porous matrix for facile nucleation.

5. The method of claim 4, wherein during the pre-processing step, selective pre-treatment is performed such that the diamond powders do not contact with a certain portion of the surface of the porous matrix so that a diamond film cannot be formed on the certain portion during the depositing step, to thereby form an opening.

6. A method for fabricating a diamond shell comprising:
preparing a porous matrix having one of a spherical and polyhedral shape;
inserting the porous matrix into a diamond synthesis vacuum container;
decomposing a raw material precursor gas for diamond deposition with a CVD method via plasma or thermal energy, to thereby deposit a uniform diamond film having one or more pores, through which a liquid phase can pass, onto the porous matrix to thereby obtain a diamond/matrix composite; and
putting the composite into an etching solution to remove the porous matrix by a capillary phenomenon through the one or more pores, wherein the porous matrix absorbs the etching solution to thereby remove the porous matrix from the composite,
wherein, in the step of fabricating the diamond/matrix composite, the size of a pore of the diamond film is controlled to be 1Å~5μm by controlling the nuclear density and the thickness of the film.

7. The method of claim 4, wherein, in the pre-processing step on the porous matrix, the size of the one or more pores of the diamond film is controlled to be 1Å~5μm by controlling the nuclear density and the thickness of the film according to a change of the pre-processing time.

8. The method of claim 1, wherein, in the step of fabricating the diamond/matrix composite, the porous matrix is synthesized during a certain time, re-arranged, and then synthesized again, in order to uniformly deposit a diamond film on the surface of the porous matrix.

9. A method for fabricating a diamond shell comprising:
preparing a porous matrix having one of a spherical or polyhedral shape;
inserting the porous matrix into a diamond synthesis vacuum container;
decomposing a raw material precursor gas for diamond deposition with a CVD method via plasma or thermal energy, to thereby deposit a uniform diamond film having one or more pores, through which a liquid phase can pass, onto the porous matrix to thereby obtain a diamond/matrix composite; and
putting the composite into an etching solution to remove the porous matrix by a capillary phenomenon through the one or more pores, wherein the porous matrix absorbs the etching solution to thereby remove the porous matrix from the composite,
wherein the porous matrix contains silica ($SiO_2$) and the porous matrix is etched and removed by using a hydrofluoric acid as the etching solution, and wherein a porous silicon carbide layer, formed between the porous matrix and the diamond film, remains to form a diamond/silicon carbide composite shell.

10. A method for fabricating a diamond shell comprising:
preparing a porous matrix having one of a spherical and polyhedral shape;
inserting the porous matrix into a diamond synthesis vacuum container;
decomposing a raw material precursor gas for diamond deposition with a CVD method via plasma or thermal energy, to thereby deposit a uniform diamond film having one or more pores, through which a liquid phase can pass, onto the porous matrix to thereby obtain a diamond/matrix composite; and
putting the composite into an etching solution to remove the porous matrix by a capillary phenomenon through the one or more pores, wherein the porous matrix absorbs the etching solution to thereby remove the porous matrix from the composite,
wherein the porous matrix contains silica ($SiO_2$), and both a porous silicon carbide layer, formed between the porous matrix and the diamond film, and the porous matrix are simultaneously removed by using a boiling Murakami solution as the etching solution.

11. A method for increasing thickness of a spherically shaped hollow diamond shell comprising:
preparing a porous matrix having an overall discrete spherical shape;
depositing a uniform diamond film, wherein the diamond film includes one or more pores, the diamond film being deposited onto the porous matrix in a CVD chamber, the depositing comprising decomposing precursor gases for diamond deposition by plasma or thermal energy the depositing of the uniform diamond film forming a diamond/matrix composite;
etching out the porous matrix of the composite via an etching solution, the etching being effected via a capillary phenomenon wherein the capillary phenomenon is such that the porous matrix absorbs the etching solution through the one or more pores in the diamond film, the one or more pores thereby functioning as openings in the diamond film, in order to obtain a spherically shaped hollow diamond shell;
inserting the spherically shaped hollow diamond shell as a matrix, into a diamond synthesis vacuum container, and by a CVD method, decomposing a precursor gas for diamond deposition by plasma or thermal energy to thereby synthesize a diamond film onto the hollow diamond shell matrix, in order to obtain a thick hollow diamond shell with a thickness 10 percent or greater of the original shell thickness.

12. A method for increasing thickness of a spherically or polyhedrally shaped hollow diamond/silicon carbide composite shell comprising:
inserting a porous matrix into a diamond synthesis vacuum container;
decomposing a raw material precursor gas for diamond deposition with a CVD method via plasma or thermal energy , to thereby deposit a uniform diamond film having one or more pores, through which a liquid phase can pass, onto the porous matrix to thereby obtain a diamond/matrix composite;
putting the composite into an etching solution to remove the porous matrix by a capillary phenomenon through the one or more sores wherein the porous matrix absorbs the etching solution to thereby remove the porous matrix from the composite in order to obtain a spherically or polyhedrally shaped hollow diamond/silicon carbide composite shell;

inserting the hollow diamond/silicon carbide composite shell as a matrix into a diamond synthesis vacuum container, and by a CVD method, decomposing a precursor gas for diamond deposition by plasma or thermal energy to thereby synthesize a diamond film onto the hollow diamond/silicon carbide composite shell, in order to obtain a thick hollow diamond/silicon carbide composite shell with a thickness at least 10 percent greater than the original shell thickness, wherein the porous matrix contains silica ($SiO_2$) and the porous matrix is etched and removed by using a hydrofluoric acid as the etching solution and wherein a porous silicon carbide layer, formed between the porous matrix and the diamond film, remains to form a diamond/silicon carbide composite shell.

* * * * *